(12) United States Patent
Ong et al.

(10) Patent No.: US 10,964,677 B2
(45) Date of Patent: Mar. 30, 2021

(54) ELECTRONIC PACKAGES WITH STACKED SITFFENERS AND METHODS OF ASSEMBLING SAME

(71) Applicant: Intel Corporation, Santa Clara, CA (US)

(72) Inventors: Jenny Shio Yin Ong, Bayan Lepas (MY); Bok Eng Cheah, Bukit Gambir (MY); Jackson Chung Peng Kong, Tanjung Tokong (MY); Seok Ling Lim, Kulim (MY); Kooi Chi Ooi, Glugor (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/845,492

(22) Filed: Dec. 18, 2017

(65) Prior Publication Data
US 2019/0109122 A1 Apr. 11, 2019

(30) Foreign Application Priority Data
Oct. 6, 2017 (MY) .......................... PI 2017703800

(51) Int. Cl.
*H01L 25/00* (2006.01)
*H01L 25/16* (2006.01)
(Continued)

(52) U.S. Cl.
CPC .......... *H01L 25/16* (2013.01); *H01L 21/4853* (2013.01); *H01L 21/4875* (2013.01); *H01L 23/13* (2013.01); *H01L 23/16* (2013.01); *H01L 23/36* (2013.01); *H01L 23/3675* (2013.01); *H01L 23/492* (2013.01); *H01L 23/50* (2013.01); *H01L 23/5389* (2013.01); *H01L 23/562* (2013.01); *H01L 24/16* (2013.01); *H01L 24/32* (2013.01); *H01L 24/73* (2013.01); *H01L 23/49816* (2013.01); *H01L 2224/16146* (2013.01); *H01L 2224/16227* (2013.01); *H01L 2224/16235* (2013.01); *H01L 2224/17181* (2013.01); *H01L 2224/3213* (2013.01); *H01L 2224/32155* (2013.01); *H01L 2224/32195* (2013.01); *H01L 2224/73203* (2013.01);
(Continued)

(58) Field of Classification Search
CPC ............... H01L 21/4871; H01L 23/492; H01L 2224/3213; H01L 2224/32195; H01L 2924/19041
See application file for complete search history.

(56) References Cited

U.S. PATENT DOCUMENTS 7,115,988 B1 * 10/2006 Hool ........................ H01L 23/36
257/713
8,405,187 B2 * 3/2013 Tosaya .................... H01L 23/16
257/528

(Continued)

*Primary Examiner* — Rockshana D Chowdhury
*Assistant Examiner* — Douglas R Burtner
(74) *Attorney, Agent, or Firm* — Schwegman Lundberg & Woessner, P.A.

(57) ABSTRACT

A semiconductor package apparatus includes a passive device that is embedded in a bottom package stiffener, and a top stiffener is stacked above the bottom package stiffener. Electrical connection through the passive device is accomplished through the stiffeners to a semiconductor die that is seated upon an infield region of the semiconductor package substrate.

16 Claims, 6 Drawing Sheets

(51) Int. Cl.
*H01L 21/48* (2006.01)
*H01L 23/00* (2006.01)
*H01L 23/492* (2006.01)
*H01L 23/538* (2006.01)
*H01L 23/367* (2006.01)
*H01L 23/13* (2006.01)
*H01L 23/16* (2006.01)
*H01L 23/50* (2006.01)
*H01L 23/36* (2006.01)
H01L 23/498 (2006.01)
H05K 1/18 (2006.01)

(52) U.S. Cl.
CPC .............. *H01L 2924/1432* (2013.01); *H01L 2924/19041* (2013.01); *H01L 2924/19105* (2013.01); *H05K 1/181* (2013.01); *H05K 2201/10734* (2013.01)

(56) References Cited

U.S. PATENT DOCUMENTS

| | | | |
|---|---|---|---|
| 2003/0062618 A1* | 4/2003 | Xie | H01L 23/4985 257/712 |
| 2009/0001528 A1* | 1/2009 | Braunisch | H01L 23/647 257/659 |
| 2009/0302439 A1* | 12/2009 | Pagaila | H01L 23/3128 257/660 |
| 2010/0155927 A1* | 6/2010 | Cheah | H01L 23/49833 257/691 |
| 2010/0213599 A1* | 8/2010 | Watanabe | H01L 24/24 257/693 |
| 2012/0087097 A1* | 4/2012 | Hong | H05K 3/4608 361/763 |
| 2015/0243632 A1* | 8/2015 | Inoue | H01L 24/97 257/774 |
| 2017/0033038 A1* | 2/2017 | Nakagawa | H01L 23/49816 |

* cited by examiner

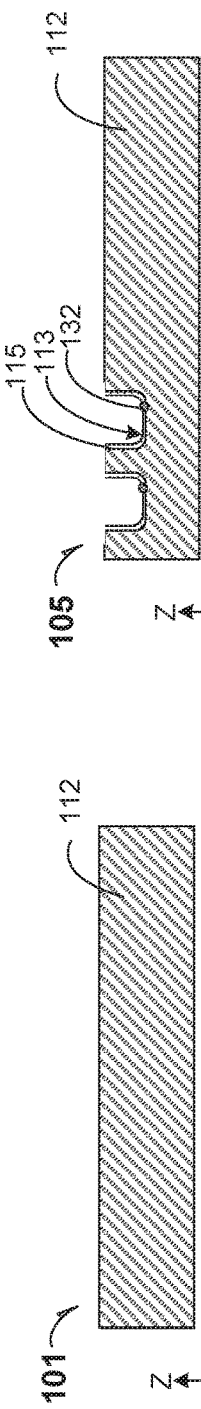
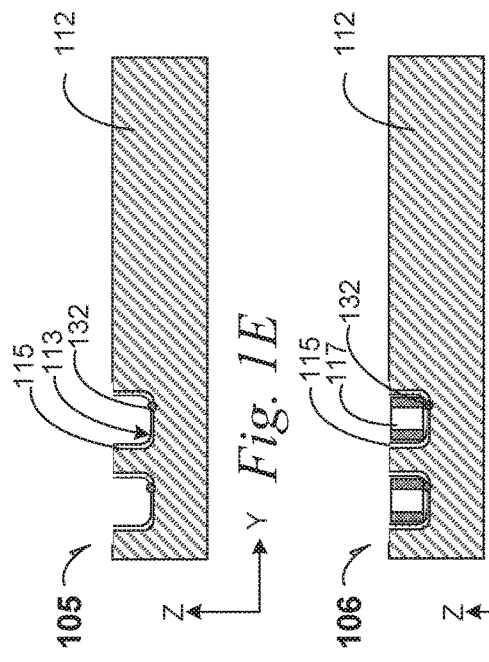
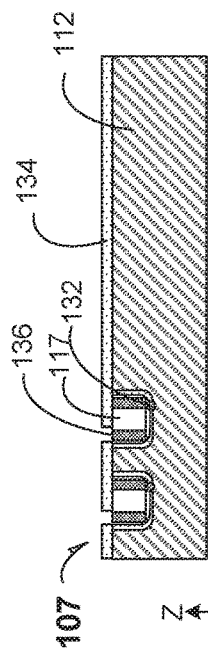
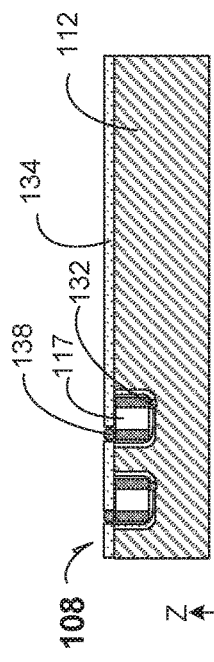
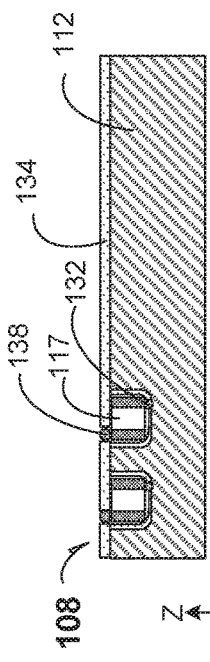
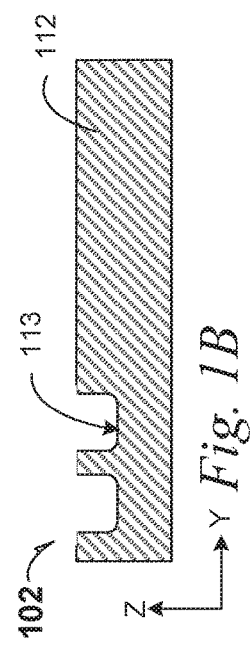
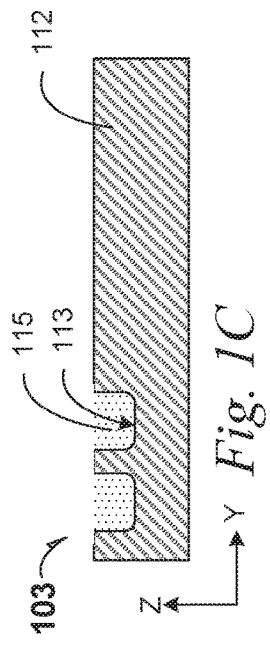

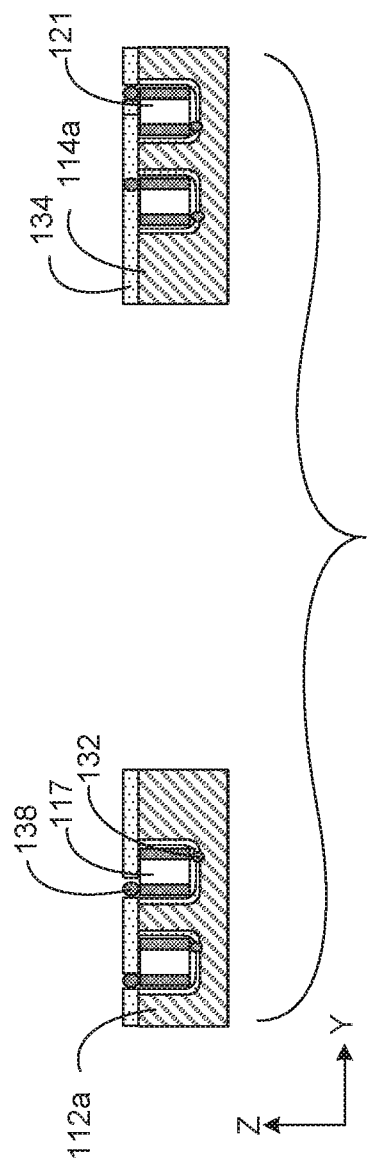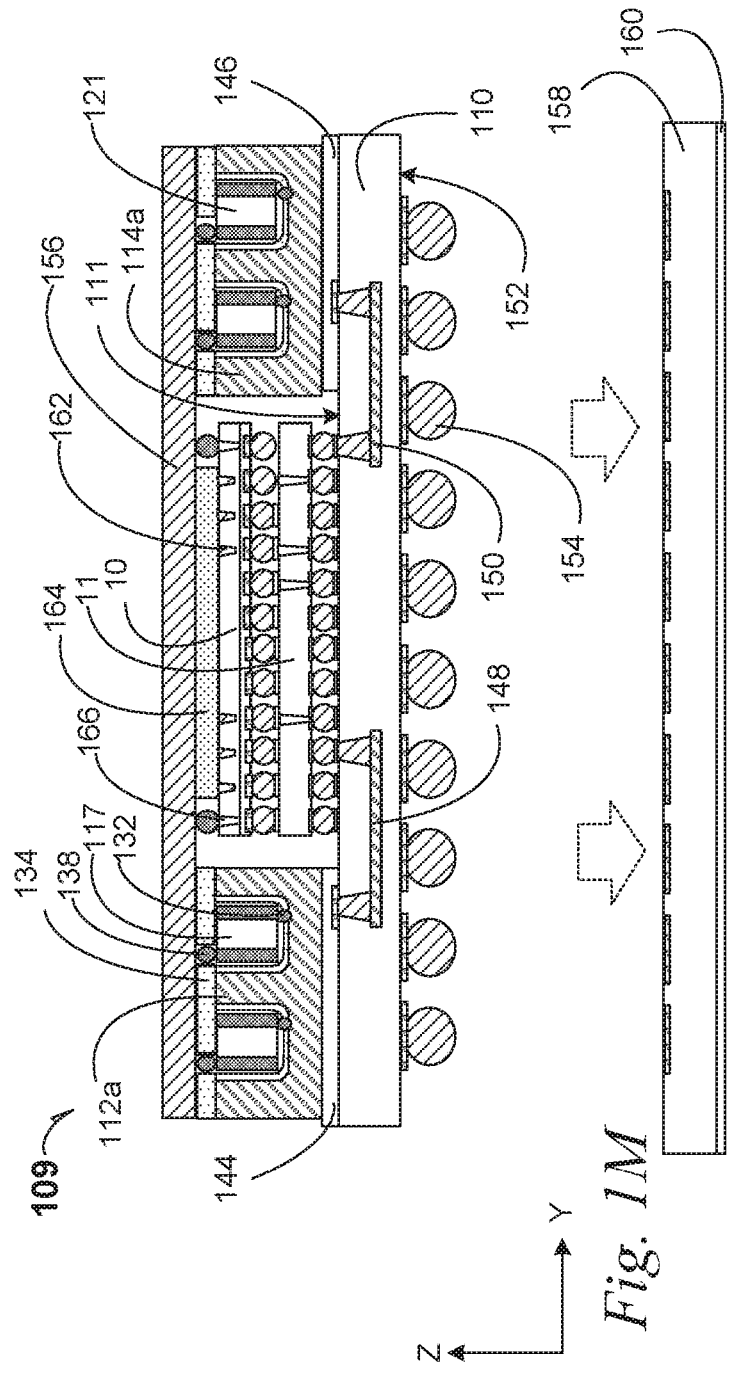

ELECTRONIC PACKAGES WITH STACKED SITFFENERS AND METHODS OF ASSEMBLING SAME

PRIORITY APPLICATION

This application claims the benefit of priority to Malaysian Application Serial Number PI 2017703800, filed Oct. 6, 2017, which is incorporated herein by reference in its entirety.

FIELD

This disclosure relates to semiconductor package stiffeners and to integrated capacitors for smaller form-factor packaging.

BACKGROUND

Semiconductive device miniaturization during packaging includes challenges to locate passive devices in useful proximity to other structures and to manage package physical integrity.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1A is a cross-section elevation of a stiffener precursor during fabrication according to an embodiment;

FIG. 1B is a cross-section elevation of the stiffener precursor depicted in FIG. 1A after further fabrication according to an embodiment;

FIG. 1C is a cross-section elevation of the stiffener precursor depicted in FIG. 1B after further fabrication according to an embodiment;

FIG. 1D is a cross-section elevation of the stiffener precursor depicted in FIG. 1C after further fabrication according to an embodiment;

FIG. 1E is a cross-section elevation of the stiffener precursor depicted in FIG. 1D after further fabrication according to an embodiment;

FIG. 1F is a cross-section elevation of the stiffener precursor depicted in FIG. 1E after further assembly according to an embodiment;

FIG. 1G is a cross-section elevation of the stiffener precursor depicted in FIG. 1F after further assembly according to an embodiment;

FIG. 1H is a cross-section elevation of the stiffener precursor depicted in FIG. 1G after further assembly according to an embodiment;

FIG. 1K is a cross-section elevation of the stiffener precursor as part of package bottom stiffener composite depicted in FIG. 1H after further assembly according to an embodiment.

FIG. 1M is a cross-section elevation of the semiconductor package apparatus depicted in FIG. 1xz after further processing according to an embodiment;

DETAILED DESCRIPTION

A die-side capacitor (DSC) is located near an active semiconductor device it is servicing. Disclosed embodiments include a DSC that is embedded in a package stiffener. A top stiffener is stacked onto the package stiffener. Both the DSC and the package stiffener are located on the die side of a semiconductive device package. A trade-off for placing a passive device close to an active semiconductor device is resolved by embedding the passive device in package stiffener. The embedded passive device presents a small X-Y footprint of useful components on the die side of the semiconductive device package, and the stacked-stiffener semiconductive package configuration also presents an improved device thermal management.

This disclosure includes package form-factor miniaturization that includes the elimination of the need for a larger X-Y footprint even though DSC installations are incorporated. Routing capacity is also increased by locating a given DSC at a useful distance from a semiconductive device such as a central processing unit.

By incorporating a DSC into a die-side package stiffener, the land side of a package substrate is freed up for a fully populated ball-grid array for both I/O and power/ground routing. Consequently, no land-side capacitor (LSC) may be needed. Similarly, placing DSCs within the X-Y footprint as well as the Z-height of the die-side stiffener, can obviate the need for a recess-in package-board structures including motherboard type structures. The stacked-stiffener configuration also functions as a composite integrated heat spreader (IHS) to facilitate unproved thermal dissipation from the semiconductive device.

Disclosed embodiments exhibit useful power-integrity performance while providing a small X-Y footprint, an improved thermal dissipation efficiency and still a DSC configuration creates shorter inductance loops and useful capacitor response times.

Figure 1:
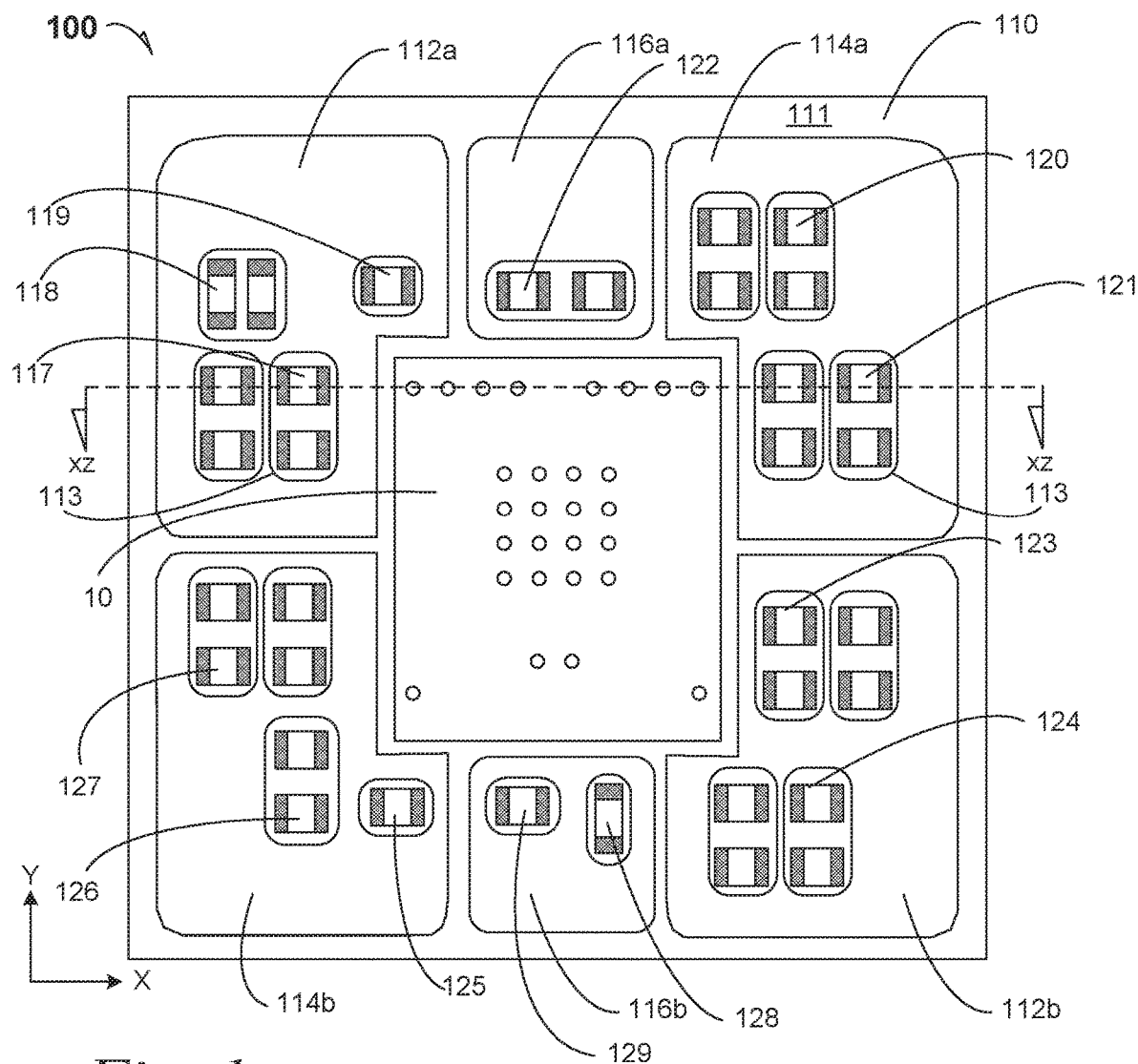
FIG. 1 is a top plan of a semiconductor package apparatus that includes stacked stiffeners that incorporate passive components within both the semiconductor package footprint and the Z-profile according to an embodiment.

FIG. 1 is a top plan of a semiconductor package apparatus 100 that includes stacked stiffeners that incorporate passive components within both the semiconductor package footprint and the Z-profile according to an embodiment. The stacked stiffeners are achieved when a top plate stiffener is stacked onto a bottom stiffener component. The bottom stiffener components are mounted on a semiconductor package substrate 110 on a die side 111. As illustrated, the bottom stiffener components are segmented and assembled around a rectangular infield.

In an embodiment, a first bottom stiffener component 112a and 112b includes two occurrences. The first bottom stiffener components 112a and 112b have a right-hand "mitten" form factor, but the form factor is not limiting of a stiffener component type. Hereinafter, a bottom stiffener component is referred to as a package stiffener, and a top plate stiffener (see Item 156 in FIGS. 1M and 2) is referred to as the stacked stiffener.

In an embodiment, first package stiffeners 112a and 112b each have a right-hand "mitten" configuration. In an embodiment, subsequent package stiffeners 114a and 114b each have a left-hand "mitten" configuration. In an embodiment, third package stiffeners 116a and 116b have quadrilateral configurations. As an assembly, the package stiffeners 112a, 112b, 114a, 114b, 116a and 116b surround a semiconductor device 10 that is within an infield region created by the several package stiffeners, on the die side 111 of the package substrate 110. In an embodiment, the semiconductor device 10 is a single semiconductive die 10.

In an embodiment, package stiffeners are used such that certain package stiffeners are electrically connected in the circuitry of the semiconductor package substrate 110 associated with one or more power rails, and the package stiffeners are configured to respective power supply voltages (VCCs). In an embodiment, the stacked stiffener (see Item 156 in FIG. 1M) is electrically connected in the circuitry of the semiconductor package substrate 110 associated to a reference voltage e.g., a ground reference voltage (VSS).

Figure 1X:
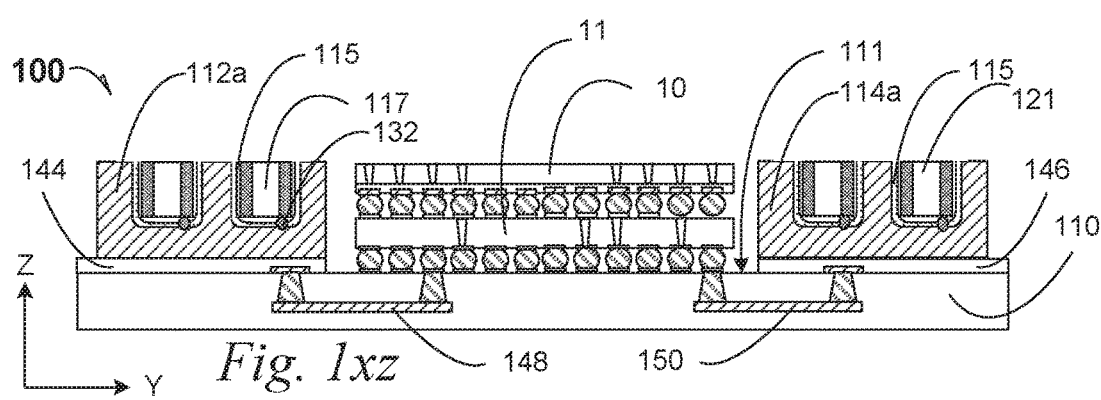
FIG. 1xz is a cross-section elevation and partial cut away of the semiconductor package apparatus depicted in FIG. 1 according to an embodiment.

In an embodiment, an active device is disposed on the die side 111, such as a first die 11 (see FIGS. 1xz and 1M). In an embodiment, the first die 11 is a logic processor such as manufactured by Intel Corporation of Santa Clara, Calif. As illustrated, the first die 11 is seated above the infield region of the die side 111, where the infield region is created by the inner contours of the several package stiffeners.

In an embodiment, several dice are seated on the die side 111 such as a central processing unit (CPU) die, a platform controller hub (PCH) die, a dynamic random access memory (DRAM) die, and a graphic processing unit (GPU) die.

In an embodiment, a series of passive devices such as capacitors is supplied in recesses within the several package stiffeners. As illustrated, capacitor groups are provided, beginning at the first package stiffener 112a with a four-capacitor group 117, a two-capacitor group 118 and a single capacitor 119. Within the subsequent package stiffener 114a is a four-capacitor group 120 (two, two-capacitor groups symmetrically side-by side) and a four-capacitor group 121. Within a third package stiffener 116a is a two-capacitor group 122. Within a fourth package stiffener 112b is a four-capacitor group 123 and a four-capacitor group 124. Within a fifth package stiffener 114b is a single capacitor 125, a two-capacitor group 126 and a four-capacitor group 127. Within a sixth package stiffener 116b is a single capacitor 128 and an additional single capacitor 129.

As illustrated by the space available, other-numbers of capacitor groups may be assembled such as into a five-capacitor group in an embodiment.

FIG. 1A is a cross-section elevation 101 of a stiffener precursor 112 during fabrication according to an embodiment. A stiffener precursor 112 is provided that is used during fabrication to allow for a passive device to be seated within the Z-direction profile of the stiffener precursor 112. In an embodiment, the stiffener precursor 112 is a copper-containing material. In an embodiment, the stiffener precursor 112 is a silver-containing material. In an embodiment, the stiffener precursor 112 is an aluminum-containing material. Other metallic materials may be employed where appropriate for a useful application. In an embodiment, the stiffeners are made from aluminum metal plate. In an embodiment, the stiffeners are made from copper metal plate. In an embodiment, the stiffeners present a Z-direction profile in a range from 100 micrometer (μm) to 400 μm.

FIG. 1B is a cross-section elevation 102 of the stiffener precursor 112 depicted in FIG. 1A after further fabrication according to an embodiment. A passive-device recess 113 has been formed into the surface of the stiffener precursor 112. In an embodiment, the passive-device recess 113 is formed by a physical-drilling process. In an embodiment, the passive-device recess 113 is formed by a laser-drilling process. In an embodiment, the passive-device recess 113 is formed by a physical-drilling process, and a laser-drilling process.

FIG. 1C is a cross-section elevation 103 of the stiffener precursor 112 depicted in FIG. 1B after further fabrication according to an embodiment. The passive-device recess 113 has been filled with a dielectric filler 115 to electrically insulate a passive device that is to be seated into the passive device recess 113. In an embodiment, the dielectric filler 115 is formed by filling with a squeegee that wipes dielectric filler 115 into the passive device recess 113. In an embodiment, the dielectric filler 115 is printed into the passive device recess 113. In an embodiment, the dielectric filler 115 comprises a non-conductive material such as polyimide, bismaleimide-triazine epoxy resin and silicone polymer.

FIG. 1D is a cross-section elevation 104 of the stiffener precursor 112 depicted in FIG. 1C after further fabrication according to an embodiment. The dielectric filler 115 has been selectively removed to retain a dielectric liner 115, and a contact corridor 130 has been drilled through a portion of the dielectric liner 115 to allow electrical coupling of a passive device to be seated within the passive device recess 113. In an embodiment, a drilling process has removed most of the dielectric filler 115 as seen in FIG. 1C, to leave the dielectric filler liner 115 as seen in FIG. 1D. A further process is completed to open the contact corridor 130.

FIG. 1E is a cross-section elevation 105 of the stiffener precursor 112 depicted in FIG. 1D after further fabrication according to an embodiment. The contact corridor 130 (see FIG. 1D) has been filled with a solder paste 132 as a bottom electrode contact 132. The bottom electrode contact 132 is formed in anticipation of a passive device being seated within the passive device recess 113. In an embodiment, the bottom electrode contact 132 is referred to as a first contact 132. Accordingly, electrical insulation is prepared within the passive device recess 113 with the exception of the solder paste 132 that allows an electrical path through the recess. In an embodiment, the solder paste 132 is dispensed by a syringe upon an X-Y-Z coordinated robot arm.

FIG. 1F is a cross-section elevation 106 of the stiffener precursor 112 depicted in FIG. 1E after further assembly according to an embodiment. A passive device 117 has been seated within the passive device recess 113 and an electrode portion of the passive device 117 has been electrically bonded to the solder paste 132. As illustrated, electrode portions of the passive device 117, in this instance a capacitor 117, are electrically insulated from the stiffener precursor 112 by presence of the dielectric liner 115, and only the solder paste 132 within the contact corridor 130 (see FIG. 1D) allows for electrical contact between the passive device 117 and the stiffener precursor 112.

FIG. 1G is a cross-section elevation 107 of the stiffener precursor 112 depicted in FIG. 1F after further assembly according to an embodiment. A top dielectric film 134 has been formed over the stiffener precursor 112 as well as over the passive device 117, and a top contact corridor 136 has been opened in the top dielectric film 134 to expose passive device 117 at the electrode opposite that connected with the bottom solder paste 132. In an embodiment, the dielectric film 134 is spun on, cured, and patterned to open the top contact corridor 136.

FIG. 1H is a cross-section elevation 108 of the stiffener precursor 112 depicted in FIG. 1G after further assembly according to an embodiment. A top electrode contact 138 has been formed in the top contact corridor 136 (see FIG. 1G) that was opened through the top dielectric film 134. In an embodiment, the top contact 138 is referred to as a first second 138. Together with the bottom (or first) electrode contact 132, the top (or second) electrode contact 138 completes contact across the passive device 117.

FIG. 1K is a cross-section elevation of the stiffener precursor 112 as part of package bottom stiffener composite depicted in FIG. 1H after further assembly according to an embodiment. FIGS. 1I, 1J and 1L are not used. Further processing has opened an infield region within the stiffener precursor 112, depicted in FIG. 1H, to create a package stiffener 112a and a package stiffener 114a as seen in FIG. 1. In an embodiment, each package stiffener is fabricated separately. In an embodiment, a panel-level array of package stiffeners is fabricated and then pick-and-place assembled onto semiconductor package substrate. In an embodiment, the package stiffeners are formed or patterned on a panel carrier to facilitate the top stiffener (see Item 156 in FIG. 1M) stacking process, followed by a panel carrier removal process.

FIG. 1xz is a cross-section elevation and partial cut away of the semiconductor package apparatus 100 depicted in FIG. 1 according to an embodiment. FIG. 1xz is taken from the section line xz-xz in FIG. 1. In an embodiment, a subsequent die 10 is disposed on the first die 11. In an embodiment, the first die 11 is a logic processor such as a CPU 11 and the subsequent die 10 is a memory die such as a dynamic random access memory (DRAM) die 11.

In cross section, the semiconductor package apparatus 100 depicts selected capacitors 117 and 121. The capacitors 117 and 121 are positioned within the recesses 113 of the package stiffeners 112a and 114a. The capacitors 117 and 121 are positioned to be electrically coupled to the respective package stiffeners 112a and 114a with electrical insulation selectively provided by the dielectric liners 115.

Other passive devices can be located within the several package stiffeners as illustrated in FIG. 1. In any event, the passive component provides an electrical coupling path between the package stiffener and other electronic devices such as with the semiconductor device 10 depicted in FIG. 1.

By way of illustration, the capacitor 117 is illustrated with end electrodes or terminals (darker) and the capacitor body (lighter), and the capacitor 121 is electrically coupled by direct contact to the bottom solder paste 132.

In cross-section and partial cut-away view of FIG. 1xz, the package substrate 110 illustrates electrical routing and conductive adhesives 144 and 146 between the package stiffeners and active devices 10 and 11. The package stiffener 112a is affixed to the die side surface 111 by the electrically conductive adhesive film 144. Similarly, the package stiffener 114a is affixed to the die side surface 111 by an electrically conductive film 146.

Electrical routing 148 and 150 is depicted within the semiconductor package substrate 110 under the several package stiffeners 112a and 114a. Not all electrical routing is illustrated, and also not illustrated is electrical routing that is directed orthogonal to the plane of the drawing that is coupled to a semiconductive device such as the CPU 10 depicted in FIG. 1xz.

FIG. 1M is a cross-section elevation of the semiconductor package apparatus depicted in FIG. 1xz after further processing according to an embodiment. The semiconductor package apparatus 109 has been further assembled with a top stiffener 156 that has been stacked onto the package stiffeners 112a and 114a. As illustrated, the first package stiffener 112a and the subsequent package stiffener 114a are spaced apart on the die side 111 of the semiconductor package substrate 110.

The electrical routing 148 illustrates routing that allows for circuitry to be directed across the capacitor 117 beginning at e.g., the semiconductor device 11 which is referred to as the first die 11, passing into the electrical routing 148, through the package stiffener 112a, discharging across the capacitor 117, and completing at the top plate stiffener 156, which is associated with a ground reference voltage (VSS). The electrical routing 148 couples one of the electrodes or terminals of the capacitor 117 to a power rail or power supply voltage (VCC) in the first die 11. The electrical routing 148 couples the capacitor 117 to the first die 11 as well as any capacitors also present within the package stiffener 112a. In an embodiment, the electrical routing 150 couples one of the electrodes or terminals of the capacitor 121 to a different power rail or power supply voltage (VCC) in the first die 11. It can be seen that electrical routings 148 and 150 illustrative but not exhaustive illustrations of electrical routings.

In an embodiment, the adhesive films are electrically conductive, which adhere the several stiffeners to the die side 111. For example, as illustrate in FIG. 1M, the adhesive films 144 and 146 are electrically conductive to allow use of the several embedded capacitors. In an embodiment, the adhesive films 146 and 148 have a thickness in a range from 10 μm to 30 μm. In an embodiment, the adhesive films 144 and 146 are air anisotropic conductive films (ACF).

In an embodiment, the passive components are capacitors such as XLP 0402, 0201, 01005. In an embodiment, the passive components are capacitors with pole-to-pole lengths from 400 μm to 1,000 μm. In an embodiment, the passive components are capacitors with widths from 200 μm to 500 μm. And in an embodiment, the passive components are capacitors with Z-direction profiles from 150 μm to 250 μm.

In an embodiment, a ball-grid array is disposed on a land side 152 of the semiconductor package substrate 110, one electrical bump of which is indicated by reference number 154.

As depicted in FIG. 1M and in an embodiment for all package substrates in this disclosure such as the package substrate 110, the electrical bump array 154 is seated onto a board 158 such as a motherboard 158. In an embodiment, the board 158 includes a physical and electrically insulative shell 160 such as the outer shell of a computing system. Processing to seat the package substrate 110 onto the board 158 is illustrated by the directional arrows, depicted in dashed lines, that illustrate movement of the package substrate 110 toward the board 158.

Reference is again made to FIG. 1. The package stiffeners are mounted on a semiconductor package substrate 110 on the die side 111. In an embodiment, the several package stiffeners act as separate power supply voltages (VCCs), and the top plate stiffener 156 acts as a common reference voltage e.g., a ground reference voltage (VSS).

In an embodiment, the several stiffeners are power rails with a single power voltage such as 1 volt (V). In an embodiment, the several stiffeners are power rails with two voltages where one potential is different from the other potential, such as 1.5 V and 3.3 V. For example, the package stiffeners 112a and 112b carry 1.5 V and the package stiffeners 114a, 114b, 116a and 116b carry the voltage 3.3 V. In an embodiment, several package stiffeners carry voltage different from other package stiffeners. For example, the package stiffeners 112a and 112b carry the power supply voltage $Vcc1=1V$, the package stiffener 114a carries the voltage $Vcc2=1.5V$, the package stiffener 114b carries the voltage Vcc3=1.8V, the package stiffener 116a carries the voltage Vcc4=3.3V and the package stiffener 116b carries the voltage Vcc5=0.5V.

In an embodiment, active devices are disposed upon the die side 111, such as a first die 11, that is a CPU logic processor such as manufactured by Intel Corporation of Santa Clara, Calif. and the second, or subsequent die 10 (see e.g. FIG. 1xz) is a memory die.

Figure 2:
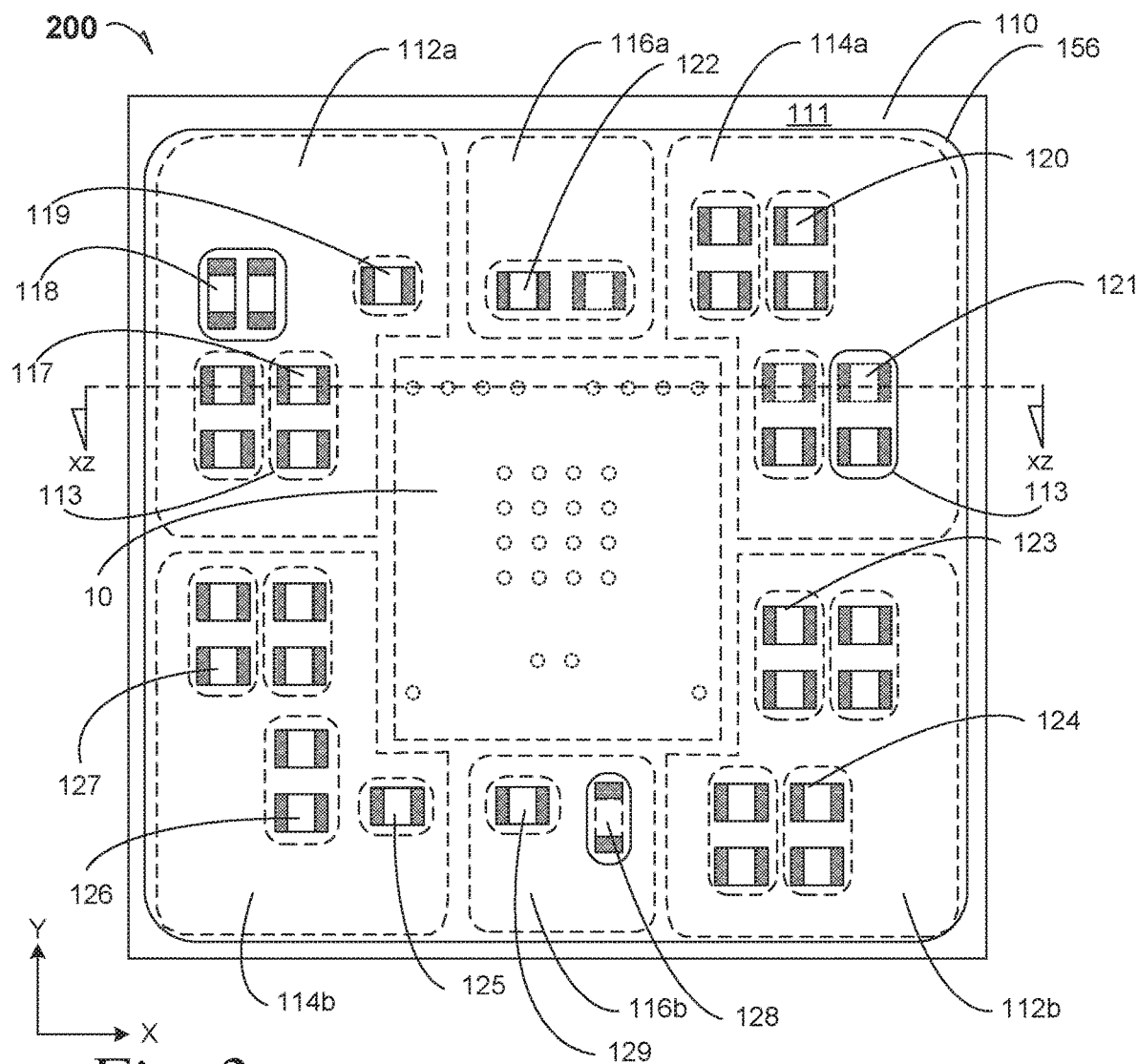
FIG. 2 is a top plan of the semiconductor package apparatus depicted in FIG. 1 after further processing according to an embodiment.

FIG. 2 is a top plan of the semiconductor package apparatus 100 depicted in FIG. 1 after further processing according to an embodiment. The semiconductor package apparatus 200 has been assembled with the top stiffener 156 such that the top stiffener 156 is stacked onto the package stiffeners 112a, 112b, 114a, 114b, 116a and 116b. The several package stiffeners as well as the semiconductive device 10 are depicted in ghosted lines as they are obscured by the top stiffener 156.

Reference is again made to FIG. 1M. As illustrated, the top stiffener 156 is seated onto the backside of the semiconductive device 10 with a thermal adhesive 164 that is used as a thermal interface material (TIM) 164. As a composite, the package stiffeners 112a, 112b, 114a, 114b, 116a and 116b and the top stiffener 156 act as a composite integrated heat spreader (IHS) that incorporates die-side capacitors within the composite IHS. In an embodiment, a thermal through-silicon via (tTSV) 162 provides an invasive conduit into the semiconductive material of the semiconductive device 10, but not into the active layer. The tTSV 162 allows excess heat to channel into the thermal adhesive 164 and further into the top stiffener 156. In an embodiment, the thermal adhesive is a metallic material such as a solder TIM.

In an embodiment, electrical circuitry is completed for a given passive device 117 by an electrical path through the stacked stiffener 156 into a reference voltage source e.g., VSS source in the semiconductive device 10 through a through-silicon via (TSV) 166.

Figure 3:
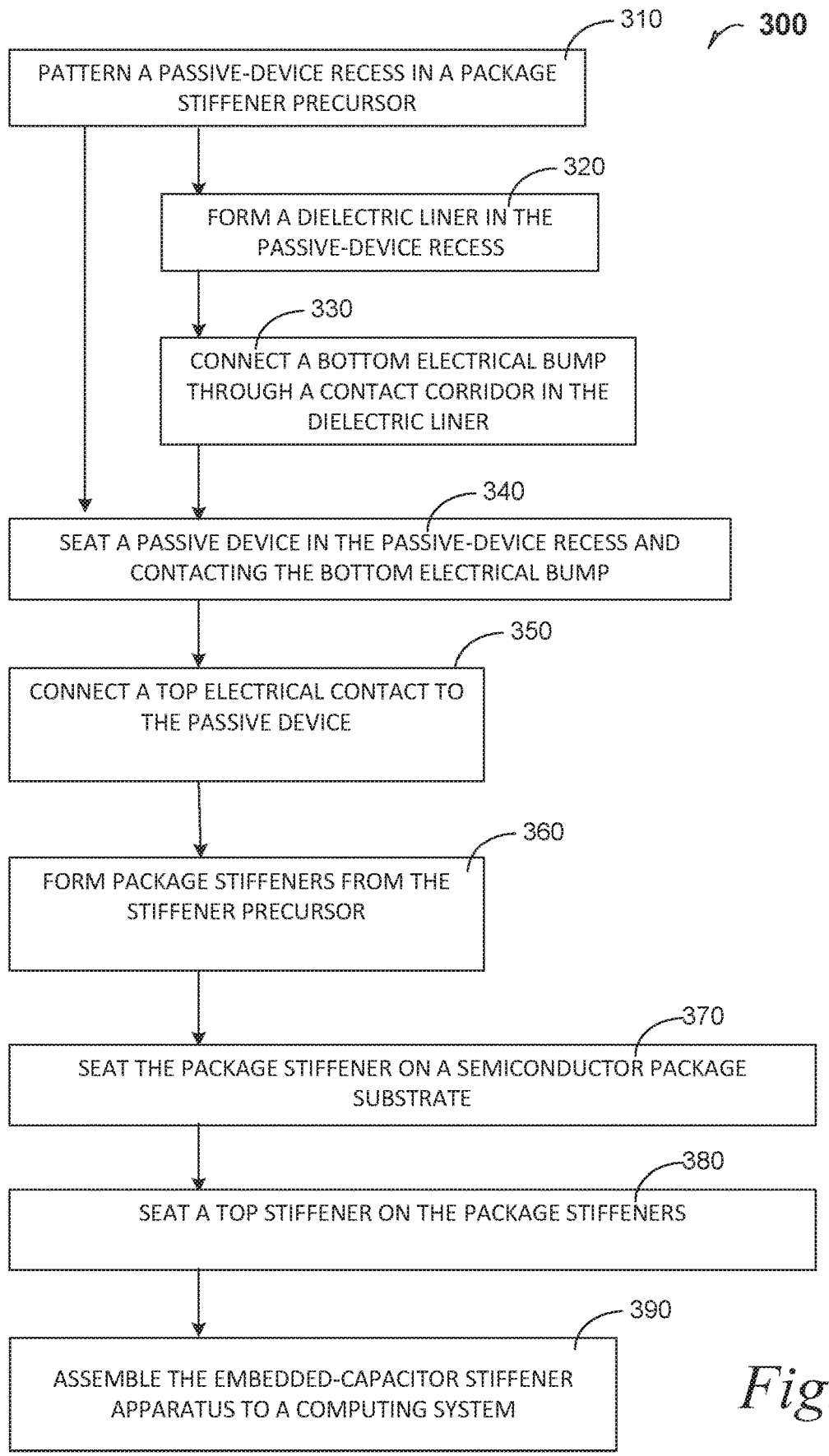
FIG. 3 is a process flow diagram according to an embodiment.

FIG. 3 is a process flow diagram 300 according to an embodiment.

At 310, the process includes patterning a passive-device recess in a package stiffener precursor. In a non-limiting example embodiment, the stiffener precursor 112 depicted in FIG. 1A is patterned to achieve the passive-device recess 113 depicted in FIG. 1B.

At 320, the process includes forming a dielectric liner in the passive-device recess. In a non-limiting example embodiment, the dielectric filler 115 depicted in FIG. 1C is centrally removed to leave the dielectric liner 115 with a contact corridor 130 depicted in FIG. 1D.

At 330, the process includes connecting a bottom electrical bump through a contact corridor in the dielectric liner at the bottom of the passive-device recess. In a non-limiting example embodiment, the bottom solder paste 132 is filled into the contactor corridor 130 as depicted in FIG. 1E.

At 340, the process includes seating a passive device into the passive-device recess and electrically coupling to the bottom contact. In a non-limiting example embodiment, the passive device 117 is seated onto the bottom electrical contact 132 as depicted in FIG. 1F.

At 350, the process includes connecting a top contact to the passive device. In a non-limiting example embodiment, the top electrode contact 138 is connected through the top dielectric film 134 that covers a portion of the stiffener precursor 112.

At 360, the process includes forming singulated package stiffeners. In a non-limiting example embodiment, a sawing process results in the package stiffener 112a and the package stiffener 114a depicted in FIG. 1K.

At 370, the process includes seating the package stiffener on a semiconductor package substrate. In a non-limiting example embodiment, the package stiffeners 112a and 114a are seated onto respective electrically conductive adhesives 144 and 146.

At 380, the process includes seating a top stiffener onto a package stiffener. In a non-limiting example embodiment, the stacked stiffener 156 is seated onto top electrical contacts 134, a TIM 164 and the top dielectric 134. In an embodiment, the top stiffener is coupled to the package stiffeners that are formed or patterned on a panel carrier to form a composite stiffener or stacked stiffener 156 prior to semiconductive package substrate assembly. In an embodiment, the top stiffener presents a Z-direction profile in a range from 20 μm to 200 μm.

At 390, the semiconductor package apparatus is assembled to a computing system.

Figure 4:
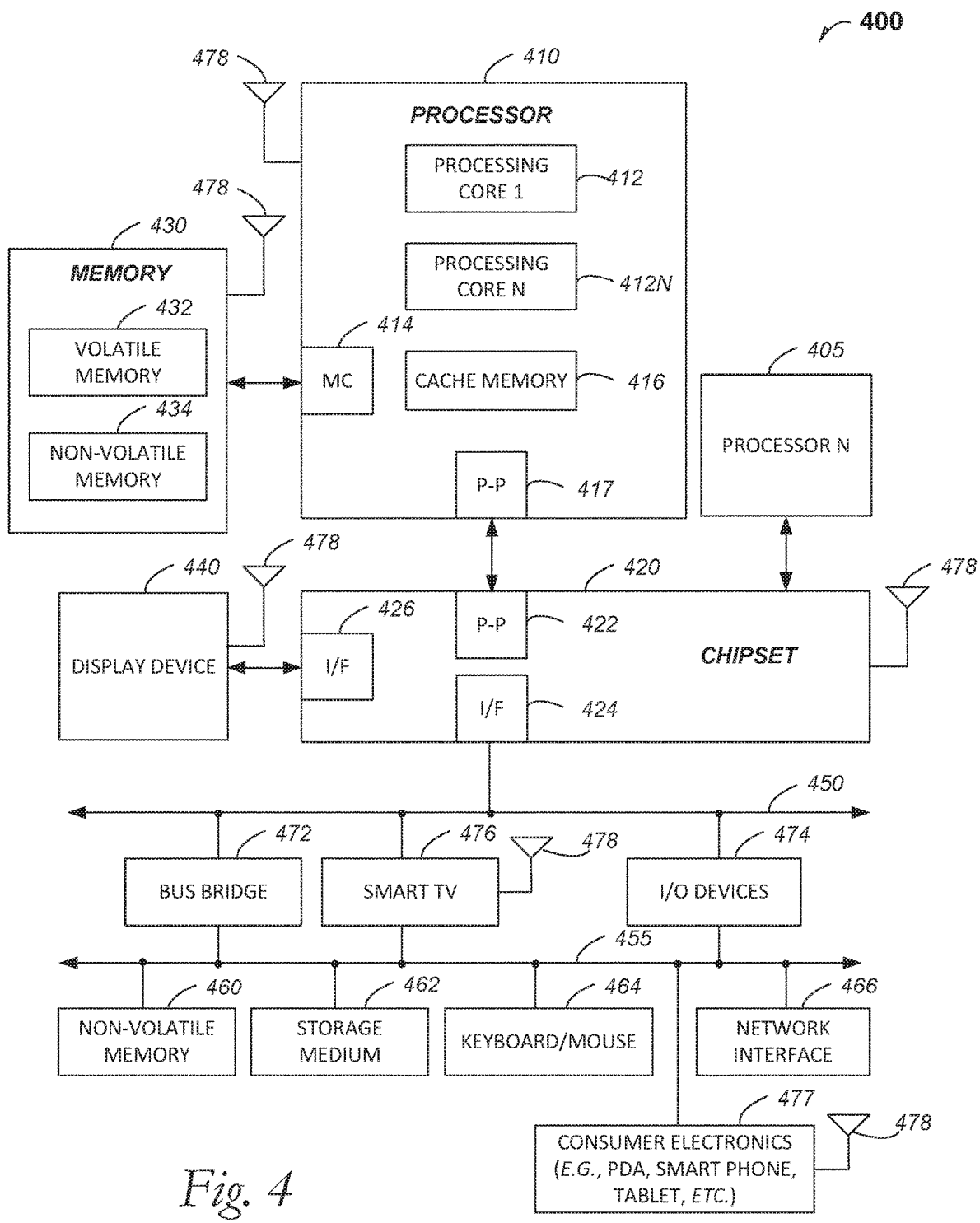
FIG. 4 is included to show an example of a higher-level device application for the disclosed embodiments.

FIG. 4 is included to show an example of a higher-level device application for the disclosed embodiments. The semiconductor package apparatus embodiments may be found in several parts of a computing system. In an embodiment, the semiconductor package apparatus is part of a communications apparatus such as is affixed to a cellular communications tower. The semiconductor package apparatus may also be referred to as a stacked composite stiffener incorporating a passive device apparatus. In an embodiment, a computing system 400 includes, but is not limited to, a desktop computer. In an embodiment, a system 400 includes, but is not limited to a laptop computer. In an embodiment, a system 400 includes, but is not limited to a netbook. In an embodiment, a system 400 includes, but is not limited to a tablet. In an embodiment, a system 400 includes, but is not limited to a notebook computer. In an embodiment, a system 400 includes, but is not limited to a personal digital assistant (PDA). In an embodiment, a system 400 includes, but is not limited to a server. In an embodiment, a system 400 includes, but is not limited to a workstation. In an embodiment, a system 400 includes, but is not limited to a cellular telephone. In an embodiment, a system 400 includes, but is not limited to a mobile computing device. In an embodiment, a system 400 includes, but is not limited to a smart phone. In an embodiment, a system 400 includes, but is not limited to an internet appliance. Other types of computing devices may be configured with the microelectronic device that includes semiconductor package apparatus embodiments.

In an embodiment, the processor 410 has one or more processing cores 412 and 412N, where 412N represents the Nth processor core inside processor 410 where N is a positive integer. In an embodiment, the electronic device system 400 using a semiconductor package apparatus embodiment that includes multiple processors including 410 and 405, where the processor 405 has logic similar or identical to the logic of the processor 410. In an embodiment, the processing core 412 includes, but is not limited to, pre-fetch logic to fetch instructions, decode logic to decode the instructions, execution logic to execute instructions and the like. In an embodiment, the processor 410 has a cache memory 416 to cache at least one of instructions and data for the semiconductor package apparatus in the system 400. The cache memory 416 may be organized into a hierarchical structure including one or more levels of cache memory.

In an embodiment, the processor 410 includes a memory controller 414, which is operable to perform functions that enable the processor 410 to access and communicate with memory 430 that includes at least one of a volatile memory 432 and a non-volatile memory 434. In an embodiment, the processor 410 is coupled with memory 430 and chipset 420. In an embodiment, the chipset 420 is seated on the die side 111 of the semiconductor package substrate 110 depicted in FIG. 1, and is part of a semiconductor package apparatus. The processor 410 may also be coupled to a wireless antenna 478 to communicate with any device configured to at least one of transmit and receive wireless signals. In an embodiment, the wireless antenna interface 478 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 434 includes, but is not limited to, flash memory, phase change memory (PCM), read-only memory (ROM), electrically erasable programmable read-only memory (EEPROM), or any other type of non-volatile memory device.

The memory 430 stores information and instructions to be executed by the processor 410. In an embodiment, the memory 430 may also store temporary variables or other intermediate information while the processor 410 is executing instructions. In the illustrated embodiment, the chipset 420 connects with processor 410 via Point-to-Point (PtP or P-P) interfaces 417 and 422. Either of these PtP embodiments may be achieved using a semiconductor package apparatus embodiment as set forth in this disclosure. The chipset 420 enables the processor 410 to connect to other elements in semiconductor package apparatus embodiments in a system 400. In an embodiment, interfaces 417 and 422 operate in accordance with a PtP communication protocol such as the Intel® QuickPath Interconnect (QPI) or the like. In other embodiments, a different interconnect may be used.

In an embodiment, the chipset 420 is operable to communicate with the processor 410, 405N, the display device 440, and other devices 472, 476, 474, 460, 462, 464, 466, 477, etc. The chipset 420 may also be coupled to a wireless antenna 478 to communicate with any device configured to at least do one of transmit and receive wireless signals.

The chipset 420 connects to the display device 440 via the interface 426. The display 440 may be, for example, a liquid crystal display (LCD), a plasma display, cathode ray tube (CRT) display, or any other form of visual display device. In an embodiment, the processor 410 and the chipset 420 are merged into a semiconductor package apparatus in a system. Additionally, the chipset 420 connects to one or more buses 450 and 455 that interconnect various elements 474, 460, 462, 464, and 466. Buses 450 and 455 may be interconnected together via a bus bridge 472 such as at least one semiconductor package apparatus embodiment. In an embodiment, the chipset 420, via interface 424, couples with a non-volatile memory 460, a mass storage device(s) 462, a keyboard/mouse 464, a network interface 466, smart TV 476, and the consumer electronics 477, etc.

In an embodiment, the mass storage device 462 includes, but is not limited to, a solid state drive, a hard disk drive, a universal serial bus flash memory drive, or any other form of computer data storage medium. In one embodiment, the network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the semiconductor package apparatus embodiment in a computing system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into the processor core 412.

Where useful, the computing system 400 may have a broadcasting structure interface such as for affixing the apparatus to a cellular tower.

To illustrate the semiconductor package apparatus embodiments and methods disclosed herein, a non-limiting list of examples is provided herein:

Example 1 is a semiconductor package apparatus, comprising: a semiconductor package substrate including a die side and land side; a package stiffener coupled to the die side by an electrically conductive adhesive; a device disposed in a recess in the package stiffener, wherein the device is electrically coupled to the package stiffener by a first contact; and a plate stiffener electrically coupled to the device by a second contact, wherein the plate stiffener is stacked above the package stiffener.

In Example 2, the subject matter of Example 1 optionally includes a semiconductive die disposed above the die side, wherein the device is a passive device, wherein the semiconductive die is electrically coupled to the passive device through the semiconductor package substrate and also to the plate stiffener by a through-silicon via of the semiconductive die.

In Example 3, the subject matter of any one or more of Examples 1-2 optionally include a semiconductive die disposed above the die side, wherein the device is a passive device, wherein the semiconductive die is electrically coupled to the passive device through the semiconductor package substrate and also to the plate stiffener.

In Example 4, the subject matter of Example 3 optionally includes wherein the passive device is a first passive device, wherein the package stiffener is a first package stiffener, further including: a subsequent package stiffener spaced apart from first package stiffener, the subsequent package stiffener including a subsequent recess in the subsequent package stiffener, wherein the subsequent package stiffener is adhered to the die side by an electrically conductive adhesive; a subsequent passive device seated in the subsequent recess, wherein the subsequent passive device is electrically coupled to the subsequent package stiffener by a bottom contact, and wherein the plate stiffener is stacked above the subsequent package stiffener.

In Example 5, the subject matter of Example 4 optionally includes wherein the first package stiffener is configured for a first electrical potential, and wherein the subsequent package stiffener is configured for a subsequent electrical potential that is different from the first electrical potential.

In Example 6, the subject matter of any one or more of Examples 4-5 optionally include wherein the first package stiffener exhibits a left-hand form factor, and wherein the subsequent package stiffener exhibits a right-hand form factor, further including a third package stiffener disposed on the die side between the first package stiffener and the subsequent package stiffener.

In Example 7, the subject matter of any one or more of Examples 1-6 optionally include wherein the package stiffener is one of a plurality of package stiffeners that form an infield upon the die side, and wherein the plate stiffener is stacked upon the plurality of package stiffeners, wherein each package stiffener includes at least one recess that is occupied by at least one passive device each.

In Example 8, the subject matter of Example 7 optionally includes wherein each of the plurality of package stiffeners includes at least two passive devices disposed within at least one recess.

In Example 9, the subject matter of any one or more of Examples 1-8 optionally include wherein the package stiffener is one of six package stiffeners that form an infield upon the die side, and wherein the plate stiffener is stacked upon the six package stiffeners, wherein each package stiffener includes at least one recess that is occupied by at least one passive device each.

In Example 10, the subject matter of Example 9 optionally includes wherein each of the six package stiffeners includes at least two passive devices disposed within at least one recess.

In Example 11, the subject matter of any one or more of Examples 1-10 optionally include wherein the device is a passive device, further including: a first semiconductive die disposed upon the die side; and a subsequent semiconductive die disposed above the first semiconductive die, wherein the subsequent semiconductive die is electrically coupled to the passive device through the semiconductor package substrate and also to the plate stiffener.

In Example 12, the subject matter of any one or more of Examples 1-11 optionally include wherein the device is a decouple capacitor.

Example 13 is a method of assembling a semiconductor package apparatus, comprising: patterning a recess in a package substrate stiffener; forming a dielectric liner in the recess; seating a passive device in the recess to contact the package substrate stiffener through a bottom contact corridor; and stacking a plate stiffener on the package substrate stiffener under conditions to electrically couple the plate stiffener to the passive device at a top contact.

In Example 14, the subject matter of Example 13 optionally includes forming the package substrate stiffener from a package substrate stiffener precursor.

In Example 15, the subject matter of Example 14 optionally includes wherein forming the package substrate stiffener includes forming a plurality of passive-device recesses in the package substrate stiffener.

In Example 16, the subject matter of any one or more of Examples 14-15 optionally include seating the package substrate stiffener on a semiconductor package substrate at a die side with an electrically conductive adhesive.

In Example 17, the subject matter of any one or more of Examples 13-16 optionally include wherein the passive device is a first passive device, wherein the package stiffener is a first package stiffener, the method further including: seating a subsequent package stiffener upon the die side with an electrically conductive adhesive, wherein the subsequent package stiffener is spaced apart from first package stiffener, the subsequent package stiffener including a subsequent recess in the subsequent package stiffener, wherein the subsequent package stiffener is adhered to the die side by an electrically conductive adhesive; and seating a subsequent passive device in the subsequent recess, wherein the subsequent passive device is electrically coupled to the subsequent package stiffener by a bottom contact, and wherein the plate stiffener is stacked above the subsequent package stiffener.

In Example 18, the subject matter of Example 17 optionally includes the method further including seating a third package stiffener on the die side between the first package stiffener and the subsequent package stiffener.

Example 19 is a computing system, comprising: a semiconductor device disposed upon a die side of a semiconductor package substrate; a first package stiffener including a first recess in the first package stiffener, wherein the first package stiffener is adhered to the die side by an electrically conductive adhesive; a first passive device seated in the first recess, wherein the first passive device is electrically coupled to the first package stiffener by a bottom contact; a subsequent package stiffener including a subsequent passive-device recess in the subsequent package stiffener, wherein the subsequent package stiffener is adhered to the die side by an electrically conductive adhesive; a subsequent passive device seated in the subsequent passive-device recess, wherein the subsequent passive device is electrically coupled to the subsequent package stiffener by a bottom contact; a plate stiffener electrically coupled to the first passive device by a top contact, and to the subsequent passive device by a top contact, and wherein the plate stiffener is stacked above the first package stiffener and the subsequent package stiffener; and a board upon which the semiconductor package substrate is mounted on a land side, wherein the board includes an outer shell.

In Example 20, the subject matter of Example 19 optionally includes a central processing unit electrically coupled to the semiconductor package substrate.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductor package apparatus, comprising:
   a semiconductor package substrate including a die side and land side;
   a metal package stiffener coupled to the die side by an electrically conductive adhesive;
   a plurality of capacitors, separate from the metal packager stiffener, and disposed in a plurality of recesses in the metal package stiffener, wherein each capacitor of the plurality of capacitors is electrically coupled to the metal package stiffener by a first contact; and
   a plate stiffener electrically coupled to the plurality of capacitors by a second contact, wherein the plate stiffener is stacked above the metal package stiffener.

2. The semiconductor package apparatus of claim 1, further including a semiconductive die disposed above the die side, Wherein the semiconductive die is electrically coupled to the plurality of capacitors through the semiconductor package substrate and also to the plate stiffener by a through-silicon via of the semiconductive die.

3. The semiconductor package apparatus of claim 1, further including a semiconductive die disposed above the die side, wherein the semiconductive die is electrically coupled to the plurality of capacitors through the semiconductor package substrate and also to the plate stiffener.

4. The semiconductor package apparatus of claim 3, wherein at least one of the plurality of capacitors is a first passive device, wherein the metal package stiffener is a first package stiffener, further including:
   a subsequent package stiffener spaced apart from first package stiffener, the subsequent package stiffener including a subsequent recess in the subsequent package stiffener, wherein the subsequent package stiffener is adhered to the die side by an electrically conductive adhesive;
   a subsequent passive device seated in the subsequent recess, wherein the subsequent passive device is electrically coupled to the subsequent package stiffener by a bottom contact, and wherein the plate stiffener is stacked above the subsequent package stiffener.

5. The semiconductor package apparatus of claim 4, wherein the first package stiffener is configured for a first electrical potential, and wherein the subsequent package stiffener is configured for a subsequent electrical potential that is different from the first electrical potential.

6. The semiconductor package apparatus of claim 4, wherein the first package stiffener exhibits a left-hand form factor, and wherein the subsequent package stiffener exhibits a right-hand form factor, further including a third package stiffener disposed on the die side between the first package stiffener and the subsequent package stiffener.

7. The semiconductor package apparatus of claim 1 wherein the package stiffener is one of a plurality of package stiffeners that form an infield upon the die side, and wherein the plate stiffener is stacked upon the plurality of package stiffeners, wherein each package stiffener includes at least one recess that is occupied by at least one passive device each.

8. The semiconductor package apparatus of claim 7, wherein each of the plurality of package stiffeners includes at least two passive devices disposed within at least one recess.

9. The semiconductor package apparatus of claim 1 wherein the package stiffener is one of six package stiffeners that form an infield upon the die side, and wherein the plate stiffener is stacked upon the six package stiffeners, wherein each package stiffener includes at least one recess that is occupied by at least one passive device each.

10. The semiconductor package apparatus of claim 9, wherein each of the six package stiffeners includes at least two passive devices disposed within at least one recess.

11. The semiconductor package apparatus of claim 1, further including:
   a first semiconductive die disposed upon the die side; and
   a subsequent semiconductive die disposed above the first semiconductive die, wherein the subsequent semiconductive die is electrically coupled to the at least one of the plurality of capacitors through the semiconductor package substrate and also to the plate stiffener.

12. The semiconductor package apparatus of claim 1, wherein the at least one of the plurality of capacitors is a decouple capacitor.

13. A semiconductor package apparatus, comprising:
   a semiconductor package substrate including a die side and land side, and wherein the apparatus occupies a z-height;
   a metal package stiffener coupled to the die side by an electrically conductive adhesive;

a plurality of capacitors, separate from the metal packager stiffener, and disposed in a plurality of recesses in the metal package stiffener, wherein each capacitor of the plurality of capacitors is electrically coupled to the metal package stiffener by a first contact, and wherein each of the plurality of capacitors occupies at least some of the same z-height; and a plate stiffener electrically coupled to the plurality of capacitors by a second contact, wherein the plate stiffener is stacked above the metal package stiffener.

14. The semiconductor package apparatus of claim 13, further including a semiconductive die disposed above the die side, wherein the semiconductive die is electrically coupled to the plurality of capacitors through the semiconductor package substrate and also to the plate stiffener by a through-silicon via of the semiconductive die.

15. The semiconductor package apparatus of claim 13, further including a semiconductive die disposed above the die side, wherein the semiconductive die is electrically coupled to the plurality of capacitors through the semiconductor package substrate and also to the plate stiffener.

16. The semiconductor package apparatus of claim 15, wherein at least one of the plurality of capacitors is a first passive device, wherein the metal package stiffener is a first package stiffener, further including:

a subsequent package stiffener spaced apart from first package stiffener, the subsequent package stiffener including a subsequent recess in the subsequent package stiffener, wherein the subsequent package stiffener is adhered to the die side by an electrically conductive adhesive;

a subsequent passive device seated in the subsequent recess, wherein the subsequent passive device is electrically coupled to the subsequent package stiffener by a bottom contact, and wherein the plate stiffener is stacked above the subsequent package stiffener.

* * * * *